United States Patent [19]

Hinkel et al.

[11] 4,386,968

[45] Jun. 7, 1983

[54] METHOD OF MAKING SEMICONDUCTOR DEVICE STRUCTURES BY MEANS OF ION IMPLANTATION UNDER A PARTIAL PRESSURE OF OXYGEN

[75] Inventors: Holger Hinkel, Boeblingen; Jürgen Kempf, Schoenaich; Georg Kraus, Wildberg; Gerhard E. Schmid, Stetten, all of Fed. Rep. of Germany

[73] Assignee: International Business Machines Corporation, Armonk, N.Y.

[21] Appl. No.: 274,986

[22] Filed: Jun. 18, 1981

[30] Foreign Application Priority Data

Sep. 19, 1980 [EP] European Pat. Off. .......... 80/105614

[51] Int. Cl.³ .................. H01L 21/263; H01L 21/265
[52] U.S. Cl. .................................... 148/1.5; 148/187; 357/91
[58] Field of Search ................... 148/1.5, 187; 357/91

[56] References Cited

U.S. PATENT DOCUMENTS

| 3,563,809 | 2/1971 | Wilson | 148/1.5 |
| 4,018,627 | 4/1977 | Polata | 148/1.5 |
| 4,144,100 | 3/1979 | MacIver et al. | 148/1.5 |
| 4,170,492 | 10/1979 | Bartlett et al. | 148/1.5 |
| 4,179,792 | 12/1979 | Marshall et al. | 29/571 |

FOREIGN PATENT DOCUMENTS 2546662  4/1977  Fed. Rep. of Germany .

OTHER PUBLICATIONS

"Ionenimplantation" by Ryssel and Ruge, p. 29, B. G. Teubner, Stuttgart, 1978.
Seidel et al., IEEE-Trans. Electron Devices, ED-24 (June 1977), 717.
Masetti et al., Solid St. Electronics, 16 (1973), 1419.
Briska et al., IBM-TDB, 23 (1980) 644.
Beyer et al., IBM-TDB, 20 (1978), 3122.

*Primary Examiner*—Upendra Roy
*Attorney, Agent, or Firm*—Joseph C. Redmond, Jr.

[57] ABSTRACT

Disclosed is a simplified method of producing semiconductor device structures in an integrated technology using at least one ion implantation step. Implantation of the doping ions into a silicon wafer, for example, for producing a subcollector or an emitter, is not effected, as previously, in an ultra-high vacuum atmosphere through a thin protective layer of silicon dioxide which is applied by a separate thermal oxidation step prior to implantation, but the doping ions are directly implanted into the bare silicon wafer. The latter implantation is effected in an atmosphere of increased partial pressure of oxygen. Enhanced diffusion of the oxygen adsorbed at the surface occurs into the vacancies which are generated by the implanted doping ions close the surface of the silicon wafer. In this manner a silicon dioxide protective layer is formed already in the initial stage of ion implantation. As a result one process step can be saved, namely, the production of the protective layer by thermal oxidation prior to ion implantation.

9 Claims, 6 Drawing Figures

METHOD OF MAKING SEMICONDUCTOR DEVICE STRUCTURES BY MEANS OF ION IMPLANTATION UNDER A PARTIAL PRESSURE OF OXYGEN

BACKGROUND OF THE INVENTION

The invention relates to a method of making semiconductor device structures using at least one ion implantation process for introducing dopants into a silicon semiconductor body.

Ion implantation has become an essential process in the production of semiconductor devices and integrated circuits where it is used to advantage for doping semiconductor regions. Besides various other applications it is also used, for instance, to trim integrated resistors, to adjust threshold voltages of FETs, etc.

Prior to performing an ion implantation process it is known to initially apply a protective layer to the surface area of the semiconductor body in which implantation is to be effected. For this purpose, a silicon dioxide layer with a thickness of about 10 nanometer (nm) is generally used. On the one hand, this protective layer serves to randomly scatter the ions impinging upon the surface of the semiconductor body, thus preventing these ions from deeply penetrating the material along preferred crystallographic directions (channeling). On the other hand, the whole semiconductor substrate is covered by the protective layer during the penetration of the dopants, so that no part of the substrate is subjected to the contaminating effects of the ambient atmosphere at any time. The ions of a contaminating material, which largely result from collisions between the doping ions of the ion beam and the ion implantation device, i.e., the lateral walls or slits shaping and forming the beam, are screened by the protective layer. Contaminations are, for example, atoms or molecules of iron, nickel, chromium, manganese or aluminum, as well as oil from the vacuum pumps. In many instances the contaminations originate from the materials used for the mask, such as carbon given off by the photoresist materials.

Silicon dioxide is suitable as a protective layer because of its compatibility with the semiconductor processes generally used. So far, protective layers have been produced from silicon dioxide by subjecting the areas of the silicon wafer to be covered with the protective layer to a dry thermal oxidation step. To this end, the semiconductor wafers were placed in an oven, where they were heated for about 15 to 30 minutes in an oxidizing atmosphere to temperatures of the order of 900° C. During this treatment a silicon dioxide layer with a thickness corresponding to the time of treatment was formed on the silicon wafer.

It is also known (U.S. Pat. No. 3,563,809) to produce implantation protective layers by direct bombardment of silicon with oxygen ions in an ultra-high vacuum. However, this method has the disadvantage that the silicon dioxide is formed only after a relatively long implantation time of about 20 to 40 minutes. This is due to the fact that all the oxygen is initially implanted into the bulk of the silicon crystal, so that the oxygen concentration at the silicon surface is small, reaching a constant maximum value only as a result of sputtering off after some time. This leads to a retarded oxygen enrichment at the crystal surface.

It is the object of the invention to provide a method for producing semiconductor devices, whereby an implantation protective layer is formed more rapidly than has been possible in accordance with the art and whereby an additional process step is saved.

SUMMARY OF THE INVENTION

In accordance with the invention it is suggested that implantation of the doping ions is effected in an atmosphere of increased partial pressure of oxygen whereby during this implantation a protective layer of silicon dioxide is formed in situ on the initially bare surface of the semiconductor body.

In accordance with preferred embodiments of the invention, doping ions, such as boron, phosphorus or arsenic, are implanted into the silicon wafer at a partial oxygen pressure of $p \geqq 5 \times 10^{-4}$ pascal (Pa). The protective layer has been found to be formed in situ on the silicon wafer already in the initial stage of the ion implantation process.

The invention permits eliminating one process step, namely, the separate formation of the silicon dioxide protective layer, thus significantly simplifying the production process of integrated circuits.

BRIEF DESCRIPTION OF THE DRAWINGS

The invention will be described in detail in the following description with reference to the drawings illustrating one specific embodiment, in which.

DETAILED DESCRIPTION OF THE INVENTION

Figure 1A:
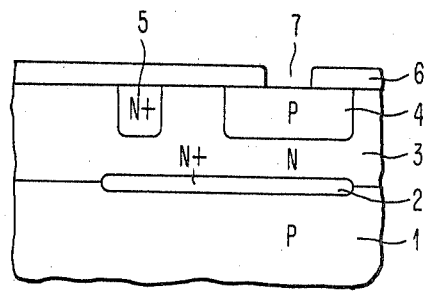
FIGS. 1A to 1C are sectional views of a semiconductor device structure after individual process steps in accordance with the art.
Figure 2A:
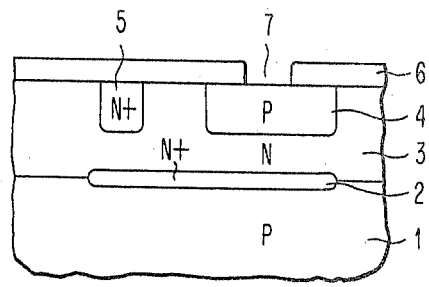
FIGS. 2A to 2C are sectional views of a semiconductor device structure after individual process steps of the method in accordance with the invention.

FIG. 1A shows a semiconductor element 1 with a subcollector 2, a collector 3, the collector contact region 5, and the base region 4 of a transistor structure. A silicon dioxide layer 6 is applied to the surface of this element, as shown in FIG. 1A. This is done by wet thermal oxidation. By means of a photolithographic process, a window 7 is opened in this layer 6 in a conventional manner. The mask thus obtained serves as an implantation mask for emitter implantation into base 4. In accordance with FIG. 1B, a thin silicon dioxide layer 8, serving as an implantation protective layer, is thermally grown in the area of window 7. It is pointed out that this method is known from the art.

Figure 1B:
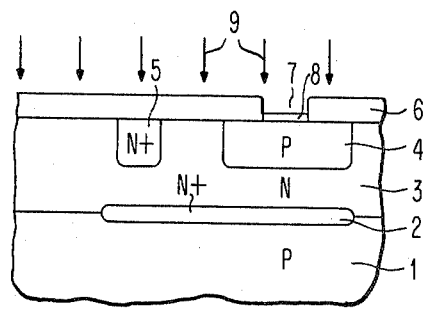
Figure 1C:
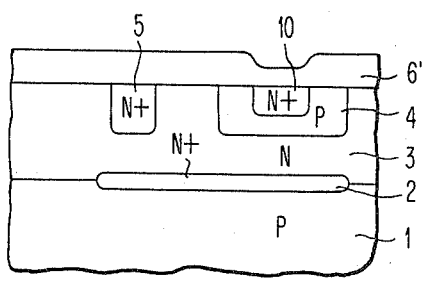

Further indicated by arrows 9 in FIG. 1B is the emitter implantation of arsenic ions. During this implantation step, the emitter doping is introduced into transistor base 4 in the area of window 7. For this purpose, $10^{16}$ arsenic ions/cm$^2$ are implanted at an energy of 50 KeV in ultra-high vacuum. After the arsenic ion implantation, the emitter drive-in diffusion is effected. To this end, the silicon wafer is heated in an oven in an oxidizing atmosphere for two hours to 1000° C. resulting in a structure as shown schematically in FIG. 1C. During this process further silicon dioxide (6') is formed in window 7 as well as on former silicon dioxide layer 6. In further process steps mask openings can be generated in layer 6' and the corresponding integrated circuit device may be completed conventionally.

Figure 2B:
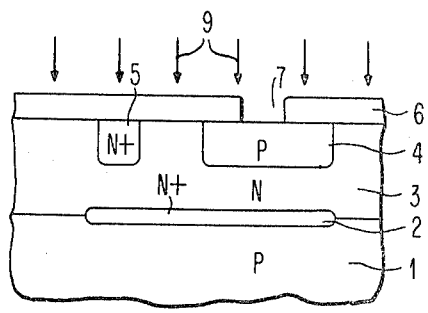
Figure 2C:
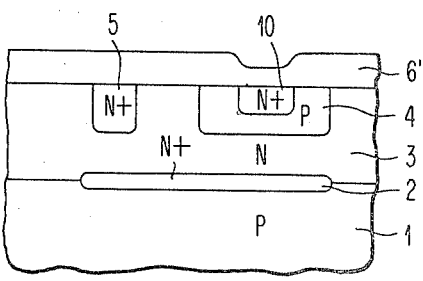

The method in accordance with the invention will be shown by means of illustrations 2A to 2C. Briefly, the separate step of thermally growing a protective layer 8 of silicon dioxide, as shown in FIG. 1B, is eliminated. In accordance with FIG. 2B, emitter implantation of the arsenic ions is effected into the bare surface of the silicon substrate (base region 4 of the transistor structure) in an atmosphere having a significant partial pressure of oxygen. This is again followed by an emitter drive-in diffusion step resulting in the structure of FIG. 2C which is the same as FIG. 1C. For this purpose the silicon wafer is heated in an oven in an oxidizing atmosphere for about two hours to 1000° C. During this process further silicon dioxide (6') is formed in the area of window 7 and silicon dioxide layer 6. In further process steps, mask openings can be produced in the silicon dioxide layer 6' and the integrated circuit device may then be completed conventionally.

It is reiterated that emitter implantation in accordance with the art is effected with $10^{16}$ arsenic ions per cm$^2$ and at an energy of 50 KeV in an ultrahigh vacuum, whereas in accordance with the method of the invention, emitter implantation is carried out under the same conditions in an atmosphere of increased partial pressure of oxygen of $p \geq 5 \times 10^{-4}$ Pa.

The method in accordance with the invention can also be used to dope a subcollector. To this end, arsenic ions are implanted at an energy of about 40–75 KeV and an ion current density of $7.5 \times 10^{-6}$ A/cm$^2$ corresponding to an ion current of about 0.70 mA during an implantation of wafers with a diameter of 82 mm. Implantation is effected into the bare surface of the silicon wafer in an atmosphere of increased partial pressure of oxygen ($p \geq 5 \times 10^{-4}$ Pa). It has been found that when the ions are directly implanted into the silicon substrate an oxide protective layer of about 2 nm thickness is formed in less than about 10% of the total implantation time.

It is attempted below to briefly explain the physical processes involved in the method in accordance with the invention. It is known that the number of vacancies in the crystal lattice can be increased by bombarding semiconductor materials with ions.

Tests of the sputter behavior of silicon have shown that when silicon is bombarded with argon at increased partial pressure of oxygen, the silicon is oxidized. In contrast to the oxidation previously explained, for which the silicon substrate is directly bombarded with oxygen ions, bombardment with argon ions leads to the formation of defects or vacancies in the silicon, which accommodate the oxygen adsorbed at the silicon surface. The tests have also shown that radiation enhanced diffusion, which in accordance with previous experience takes place only at higher temperatures, already starts at room temperature and that the silicon is oxidized to a certain degree. However, this oxidation—by bombardment of the silicon with argon ions at increased partial pressure of oxygen—proceeds relatively slowly and is not sufficient for forming an implantation protective layer of silicon dioxide in an adequately short time for the purpose of randomly scattering impinging ions and preventing contamination of the surface of the semiconductor element by sputtered materials.

If, in contrast with this, according to the invention arsenic is directly implanted into the surface of silicon wafers in an atmosphere of increased partial pressure of oxygen, a layer of silicon dioxide is formed in situ on the bare silicon wafer at adequate speed already in the initial stage of implantation. This may be explained from the fact that because of the greater mass and the higher energy of the arsenic ions a greater number of vacancies are formed in the silicon lattice (see, for instance, Ryssel/Ruge "Ionenimplantation", Teubner-Verlag Stuttgart, 1978, p. 29, Table 2.3). In addition, it may be significant that in the case of arsenic, compared with argon, the maximum of the vacancy distribution, compared with the maximum of the ion distribution, is relatively close to the crystal surface. As a result, the lifetime of the vacancies is less critical, so that during their lifetime an enhanced diffusion of the oxygen adsorbed at the surface may occur into the vacancies.

In the case of the method in accordance with the invention ion implantation can be effected in the usual manner. As implantation at increased partial pressure of oxygen pressure leads to a silicon dioxide protective layer being formed on the silicon wafer already in the initial stage of ion implantation, the separate process step of thermal oxidation for producing a protective layer prior to ion implantation can be saved. As a further result from this, transferring the silicon wafers from the implantation device to a special oven for oxidation is also eliminated which significantly contributes to achieving a good overall production yield.

While the invention has been particularly shown and described with reference to the preferred embodiments thereof, it will be understood by those skilled in the art that various changes in form and detail may be made therein without departing from the spirit and scope of the invention.

What is claimed is:

1. A method of making semiconductor device structures using at least one ion implantation process for introducing dopants into a silicon semiconductor body comprising:
    (a) covering the silicon body with a suitable surface layer acting as a masking layer during the subsequent ion implantation process;
    (b) forming in said masking layer according to the desired doping region pattern one or more openings where the bare silicon body surface is exposed;
    (c) performing the implantation process of doping ions in an atmosphere having a significant partial pressure of oxygen thereby causing a protective silicon oxide layer to be formed on the exposed surface of said silicon body during the initial stage of said implantation process, for preventing channeling and subsequent contamination effects, and thus eliminating the need for a separate oxidation process prior to said ion implantation step, and
    (d) subjecting the device structure to an anneal heat treatment to cause the diffusion and electrical activation of the implanted ions within the silicon body.

2. The method as defined in claim 1 wherein said protective silicon oxide layer is a silicon dioxide layer.

3. The method as defined in claim 2 wherein said ion implantation process is performed at a partial pressure of oxygen of $p \geq 10^{-4}$ pascal.

4. The method as defined in claim 3 wherein said doping ions are boron, phosphorus or arsenic ions.

5. The method as defined in claims 2 or 4 wherein said silicon dioxide protective layer is formed in the initial stage of the ion implantation process.

6. The method as defined in claim 5 wherein said silicon dioxide protective layer is formed with a thickness of 2 to 10 nanometer.

7. The method as defined in claims 4 or 6 wherein said desired doping region pattern includes the subcollector pattern, said ions are arsenic ions, and said implantation process is performed with a dosage of $2 \times 10^{16}$ ions/cm$^2$ at an energy of 40–75 KeV with said partial pressure of oxygen being about $5 \times 10^{-4}$ pascal.

8. The method as defined in claims 4 or 6 wherein said desired doping region pattern includes the emitter pattern, said ions are arsenic ions, and said implantation process is performed with a dosage of $10^{16}$ ions/cm² at an energy of 40–75 KeV with said partial pressure of oxygen being about $5 \times 10^{-4}$ pascal.

9. The method as defined in claims 1 or 8 wherein the diffusion of the implanted doping ions into the silicon body is effected in an oxidizing atmosphere.

* * * * *